(12) United States Patent
Khosravi et al.

(10) Patent No.: US 10,348,223 B1
(45) Date of Patent: Jul. 9, 2019

(54) ELECTRIC MOTOR STALL DETECTION

(71) Applicant: Allegro MicroSystems, LLC, Manchester, NH (US)

(72) Inventors: Kamyar Khosravi, Musselburgh (GB); Yisong Lu, Shrewsbury, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 15/967,841

(22) Filed: May 1, 2018

(51) Int. Cl.
G01R 31/02 (2006.01)
H02P 6/12 (2006.01)
G01R 31/34 (2006.01)

(52) U.S. Cl.
CPC .............. *H02P 6/12* (2013.01); *G01R 31/343* (2013.01)

(58) Field of Classification Search
CPC ............ H02P 8/34; G05B 2219/41099; G05B 2219/42108
See application file for complete search history.

(56) References Cited

U.S. PATENT DOCUMENTS

| | | | |
|---|---|---|---|
| 5,105,322 A * | 4/1992 | Steltzer | G11B 5/5504 360/261.3 |
| 5,451,849 A * | 9/1995 | Porter | B60J 7/0573 296/117 |
| 7,747,146 B2 | 6/2010 | Milano et al. | |
| 2012/0031499 A1 * | 2/2012 | Scott | F16K 31/046 137/14 |

* cited by examiner

*Primary Examiner* — Karen Masih
(74) *Attorney, Agent, or Firm* — Daly, Crowley, Mofford & Durkee, LLP

(57) ABSTRACT

A system includes a motor circuit and a calibration test circuit configured to be coupled to the motor circuit to calculate a nominal motor constant representing operation of a motor in a nominal mode, calculate a motor impedance function comprising one or more motor impedance values at one or more motor frequencies, store one or more values of the impedance function in a memory of the motor circuit, and calculate a range of acceptable motor constant values based on the nominal motor constant. The motor circuit may be configured to calculate an operating motor constant value for the motor while operating, wherein the operating motor constant value is based on at least one of the stored values of the impedance function and compare the motor constant value to the range of acceptable motor constant values stored in the memory to detect if a motor stall has occurred.

24 Claims, 8 Drawing Sheets

ELECTRIC MOTOR STALL DETECTION

FIELD

This patent relates to electric motor control.

BACKGROUND

Electric motors are used in many applications, from electric fans to vehicle engines. However, electric motors may occasionally stall. For example, an electric motor can become stuck in a particular position or vibrate back and forth due to unexpected load conditions. The motor circuit (i.e. the circuit that drives and controls the motor) is tasked with detecting and correcting a motor stall condition. The first step in correcting a stall condition may be to detect the stall and generate an error.

Many motor circuits detect a motor stall by looking for a zero-crossing in the value of a back electromotive force (back-EMF) signal. If no zero-crossing occurs, it can indicate that the motor is stalled or stuck. However, this method cannot detect if a motor is wobbling back and forward with a certain frequency. Because the back-zero crossing occurs when the motor is vibrating back and forward, the controller often assumes the frequency at which the motor is vibrating is the actual rotational speed. Therefore, using this technology it may not be possible to detect a motor stall problem.

SUMMARY

Calculating a motor constant K may be used to detect a motor stall condition. When a stall condition occurs, the motor constant may be higher or lower than an expected value. Thus, by constantly or periodically calculating the motor constant during operation of the motor and comparing it to an acceptable range it may be possible to detect the stall condition. A piece-wise linear function that defines motor impedance at different frequencies may be used to calculate the motor constant. This may result in a more accurate calculation of the motor constant and minimize erroneous stall detection.

In an embodiment, a method of driving a motor with a motor circuit includes calculating a nominal motor constant, by a motor test circuit during configuration of the motor circuit. The nominal motor constant represents operation of the motor in a nominal mode. The motor test circuit may calculate a motor impedance function during configuration of the motor. The motor impedance function may include a motor impedance at one or more motor frequencies. One or more values of the impedance function may be stored in a memory of the motor circuit. The motor circuit may calculate a range of acceptable motor constant values based on the nominal motor constant and calculate an operating motor constant value for the motor while operating. The motor constant value may be based on at least one of the stored values of the impedance function. The motor circuit may also compare the motor constant value to the range of acceptable motor constants to detect if a motor stall has occurred.

In another embodiment, a system includes a motor circuit and a calibration test circuit configured to be coupled to the motor circuit to calculate a nominal motor constant representing operation of a motor in a nominal mode, calculate a motor impedance function comprising one or more motor impedance values at one or more motor frequencies, store one or more values of the impedance function in a memory of the motor circuit, and calculate a range of acceptable motor constant values based on the nominal motor constant. The motor circuit may be configured to calculate an operating motor constant value for the motor while operating, wherein the operating motor constant value is based on at least one of the stored values of the impedance function, and compare the motor constant value to the range of acceptable motor constant values stored in the memory to detect if a motor stall has occurred.

In another embodiment, a system comprises a motor driver circuit; means for calibrating the motor driver circuit to detect motor stalls; and means for detecting, by the motor driver circuit, motor stalls during operation of a motor.

BRIEF DESCRIPTION OF THE DRAWINGS

The drawings aid in explaining and understanding the disclosed technology. Since it is often impractical or impossible to illustrate and describe every possible embodiment, the provided figures depict one or more example embodiments. Accordingly, the figures are not intended to limit the scope of the invention. Like numbers in the figures denote like elements.

DETAILED DESCRIPTION

Figure 1:
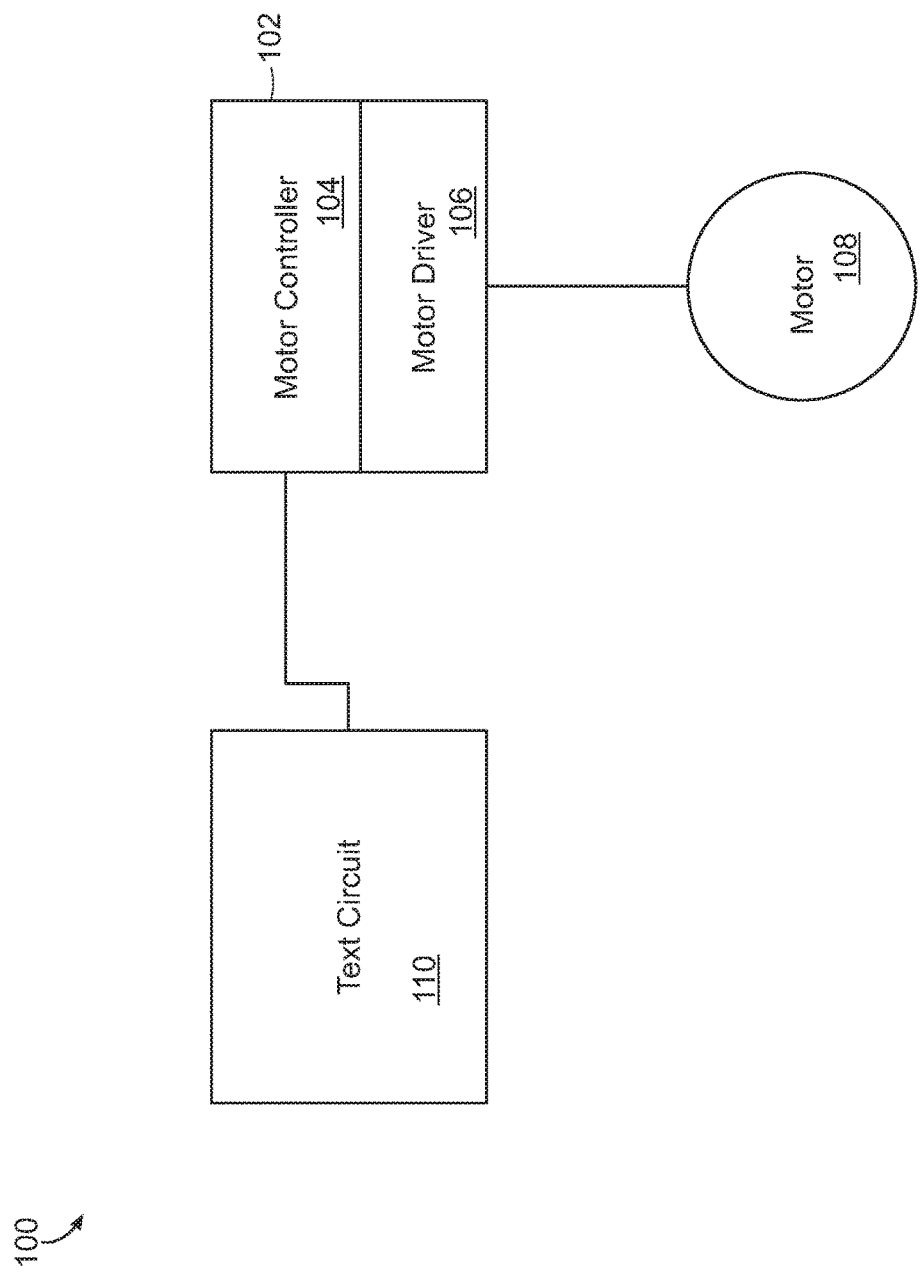
FIG. 1 is a block diagram of a system for calibrating a motor circuit.

FIG. 1 is a block diagram of a system 100 for calibrating motor circuit 102 that controls a motor 108. Calibration of motor circuit 102 may include generating and storing parameters that allow motor circuit 102 to accurately detect a motor stall condition.

Generally, motor circuit 102 may include a motor controller circuit 104 that includes logic circuits for controlling motor 108 and motor driver circuit 106 that provides electrical current to motor 108 in response to signals from motor controller circuit 104.

System 100 may be used for calibration of motor circuit 102. To achieve this goal, test circuit 110 may be coupled to motor circuit 102. Test circuit 110 may provide known inputs to motor circuit 102. These known inputs may elicit expected responses from motor circuit 102 and motor 108. While motor circuit 102 is reacting to these inputs, motor circuit 102 may monitor and measure the actual, real-world response of motor 108. If the real-world response differs from the expected response, test circuit 110 (or motor circuit 102) may store various operating parameters within motor circuit 102 to tune the real-world response to be similar to or substantially the same as the expected response. System 100 may be used to calibrate motor circuit 102 during a manufacturing and/or installation process.

System 100 may be used to calibrate motor circuit 102 so that motor circuit 102 can detect a motor stall condition. During calibration, system 100 may perform various measurements related to motor 108 at various operating points. System 100 may store within motor circuit 102 a piece-wise linear function representing motor impedances for motor 108 at the operating points. Motor circuit 102 may store an impedance function to calculate a back-EMF constant of motor 108 during operation. The calculated back-EMF constant can be compared to an acceptable range to determine if a motor stall has occurred.

Figure 2:
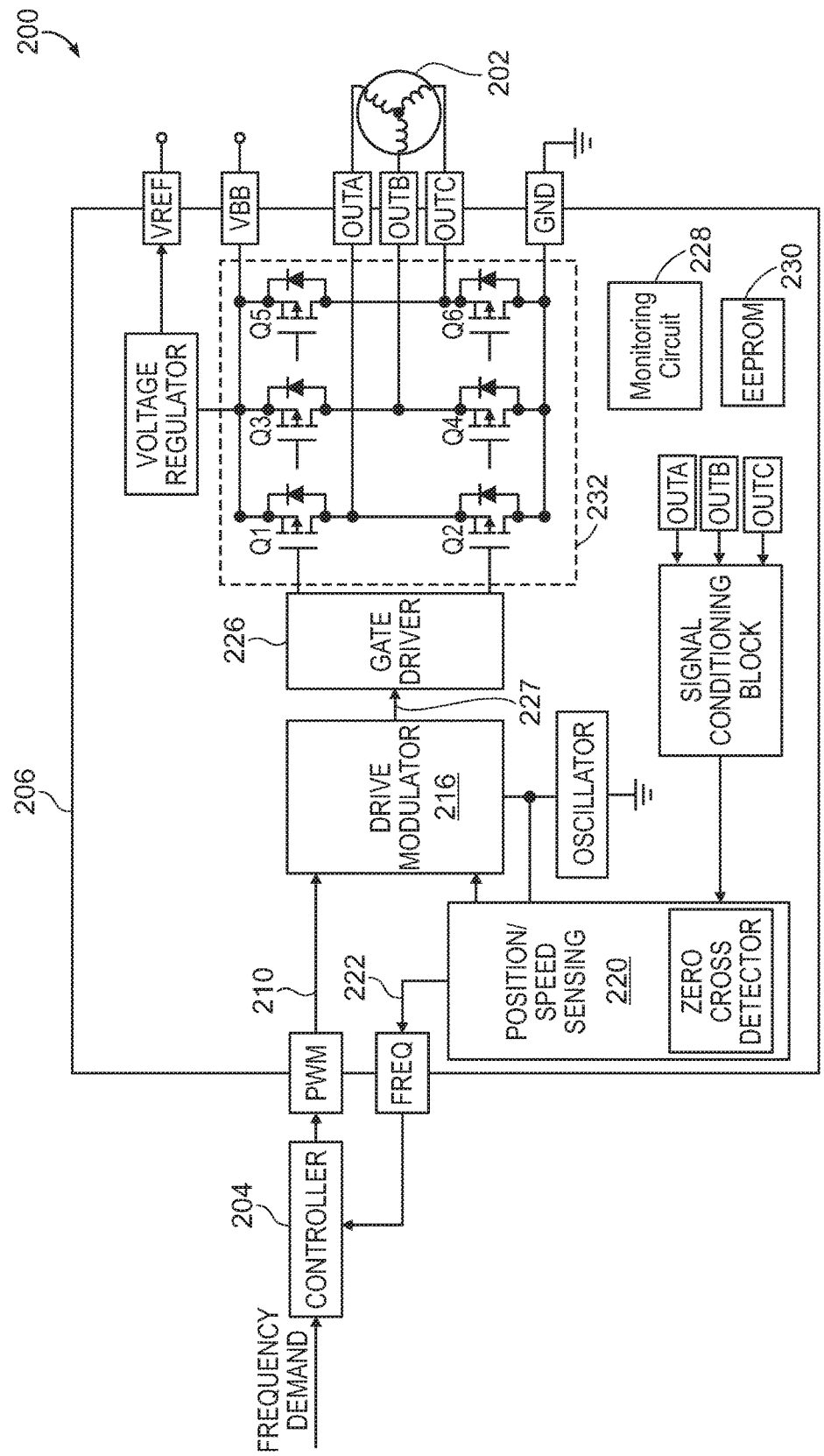
FIG. 2 is a block diagram of a motor circuit.

Referring to FIG. 2, motor circuit 200 may be the same as or similar to motor circuit 102. Motor circuit 200 is coupled to motor 202, which may be the same as or similar to motor motor 108. Motor circuit 200 may include a motor control circuit 204, which may be the same as or similar to motor control circuit 104, and may include motor driver circuit 206, which may be the same as or similar to motor driver circuit 106. In embodiments, motor control circuit 200 and/or motor driver circuit 206 is implemented as an integrated circuit chip having a plurality of input/output (I/O) pins, shown as labeled with respect to the function of each pin, for coupling to external signals and devices.

Although shown as a three-phase motor, motor 202 could include more or fewer phases. In this case, motor circuit 200 may be adapted to control a motor with more or fewer than three phases. Each phase of motor 202 may include one or more conductive windings, each of which can be depicted as an equivalent circuit having an inductor in series with a resistor and a back electromotive force ("back-EMF") voltage source. Each winding is driven by an associated motor drive signal, shown as motor drive signals OUTA, OUTB and OUTC. While a three-phase electric motor is shown, the same techniques apply to an electric motor having more than or fewer than three phases, and a corresponding more than or fewer than three drive signals.

Motor circuit 200 includes drive modulator 216 coupled to receive speed demand signal 210 from an external device coupled to motor driver circuit 206 (e.g., via the PWM pin). In general, speed demand signal 210 is indicative of a requested speed of motor 202. In some embodiments, speed demand signal 210 can be provided in one of a variety of formats, for example, a Single Edge Nibble Transmission (SENT) format, a Serial Peripheral Interface (SPI) format, a Local Interconnect Network (LIN) format, a CAN (Controller Area Network) format, an Inter-Integrated Circuit (I2C) format, or other similar signal formats. Speed demand signal 210 can be a voltage signal having a selected voltage value indicative of a desired speed of motor 202. Speed demand signal 210 may also be a pulse width modulated (PWM) signal having a selected duty cycle that represents the desired speed of motor 202. Further, speed demand signal 210 can be a digital signal having a digital value representative of the desired speed of motor 202.

In embodiments in which speed demand signal 210 is a PWM signal, the duty cycle of the PWM motor drive signal OUTA, OUTB, and OUTC may be proportional to the duty cycle of speed demand signal 210. For example, if the duty cycle of speed demand signal 210 is approximately 25%, the duty cycle of signals OUTA, OUTB, and OUTC may be about 25%; if the duty cycle of speed demand signal 210 is approximately 100%, the duty cycle of signals OUTA, OUTB, and OUTC may be about 100%; etc.

Similarly, in some particular embodiments in which speed demand signal 210 is a voltage signal having voltage values, voltage values from about one volt to about 4.3 volts are approximately linearly related to a resulting maximum duty cycle of PWM motor drive signals OUTA, OUTB and OUTC that drive motor 202.

Motor driver circuit 206 receives a positive power supply voltage (VBB) at a corresponding VBB pin, and a negative (or ground or circuit common) power supply voltage (GND) at a corresponding GND pin. Motor driver circuit 206 provides a reference voltage (VREF) at a corresponding VREF pin, for example to power external devices.

Motor driver circuit 206 provides a frequency generator (FREQ) signal at a corresponding FREQ pin, which has a frequency representative of an absolute speed of rotation of motor 202. The FREQ signal might be generated by transistor (e.g., a field effect transistor or FET) coupled in a common drain configuration using an external resistor to generate the FREQ signal. The FREQ signal can be provided to other circuits (not shown) external to motor driver circuit 206.

Gate driver 226 receives one or more signals 227 from drive modulator 216 to generate variable duty cycle PWM motor drive signals OUTA, OUTB and OUTC. More particularly, gate driver 226 generates signals that drive the gate terminals of field-effect transistors (FETs) Q1-Q6. In response, FETs Q1-Q6 turn on and off to generate the variable duty cycle PWM motor drive signals OUTA, OUTB and OUTC that provide current to motor 202 and cause motor 202 to rotate. FETs Q1 and Q2, Q3 and Q4, and Q5 and Q6 each form a corresponding half-bridge circuit, each half-bridge circuit generating a drive signal corresponding to a given phase of motor 202 (e.g., the motor drive signals OUTA, OUTB and OUTC also each correspond to a given phase of motor 202).

Each transistor Q1, Q2, Q3, Q4, Q5 and Q6 is shown as an N-channel metal oxide semiconductor field effect transistor (MOSFET) and, thus, each transistor has a corresponding intrinsic body diode arranged from drain (cathode) to source (anode) of the MOSFET, making the MOSFET able to block current in only one direction. The body diodes are thus frequently utilized as freewheeling diodes for inductive loads, such as motor 202, for example when the MOSFET is used as a switch in a half-bridge circuit.

The six transistors Q1, Q2, Q3, Q4, Q5 and Q6 are synchronized by gate driver 226 to operate in saturation to provide motor drive signals OUTA, OUTB and OUTC, respectively, to motor 202. In some embodiments, transistors Q1, Q2, Q3, Q4, Q5 and Q6 are internal to motor driver circuit 206. In other embodiments, transistors Q1, Q2, Q3, Q4, Q5 and Q6 might be external devices coupled to motor driver circuit 206. Although shown in FIG. 1 as being N-channel MOSFETs, other types of switching elements might be employed, for example P-channel MOSFETs, bipolar junction transistors (BJTs), Silicon-Controlled Rectifiers (SCRs), thyristors, triacs, or other similar switching elements.

To prevent short circuit (or "shoot through") conditions, only one transistor in each half-bridge circuit is turned on at a given time. As a precaution, gate driver 226 controls the gate terminals of the FETs so that, for short periods of time after one of the transistors of a given half-bridge circuit turns off, the other transistor cannot turn on. Thus, for those periods of time, both transistors in the given half-bridge circuit are off. This time is commonly known as "dead time" of the half-bridge circuit.

Power is provided to motor 202 by turning on an upper transistor (e.g., one of transistors Q1, Q3 and Q5) in a given half-bridge circuit to couple supply voltage VBB through the upper transistor to motor 202, and turning on a lower transistor (e.g., one of transistors Q2, Q4 and Q6) in another half-bridge circuit to couple ground voltage GND through the lower transistor to motor 202, allowing current to flow through a corresponding winding of motor 202. For example, if upper transistor Q1 is turned on, then one of lower transistors Q4 and Q6 could be turned on to allow a current to flow through an associated winding of motor 202.

Motor driver circuit 206 can also include a position/speed sensing circuit 220. Motor driver circuit 206 may produce one or more signals (e.g. signal 222) representative of the rotational position and/or rotational speed of motor 202. These signals can be fed back to controller 204 and/or drive modulator 216, which can use the signals to determine the current state of motor 202 and, if necessary, alter the signals driving motor 202 to change the state of motor 202.

Motor circuit 200 may also include a monitoring circuit 228 that monitors the states of motor 202. Monitoring circuit 228 may calculate, during operation of the motor, a current value of a motor constant while motor 202 is operating. The motor constant may be used to determine if motor 202 has stalled.

Motor circuit 200 may also include a memory 230, which may be an EEPROM or other type of non-volatile memory. Memory 230 may store one or more parameters related to the operation and/or characterization of motor 202. For example, memory 230 may store an impedance function that represents the impedance of motor 202 under various operating conditions. The impedance function may take the form of a piece-wise linear function.

Figure 3:
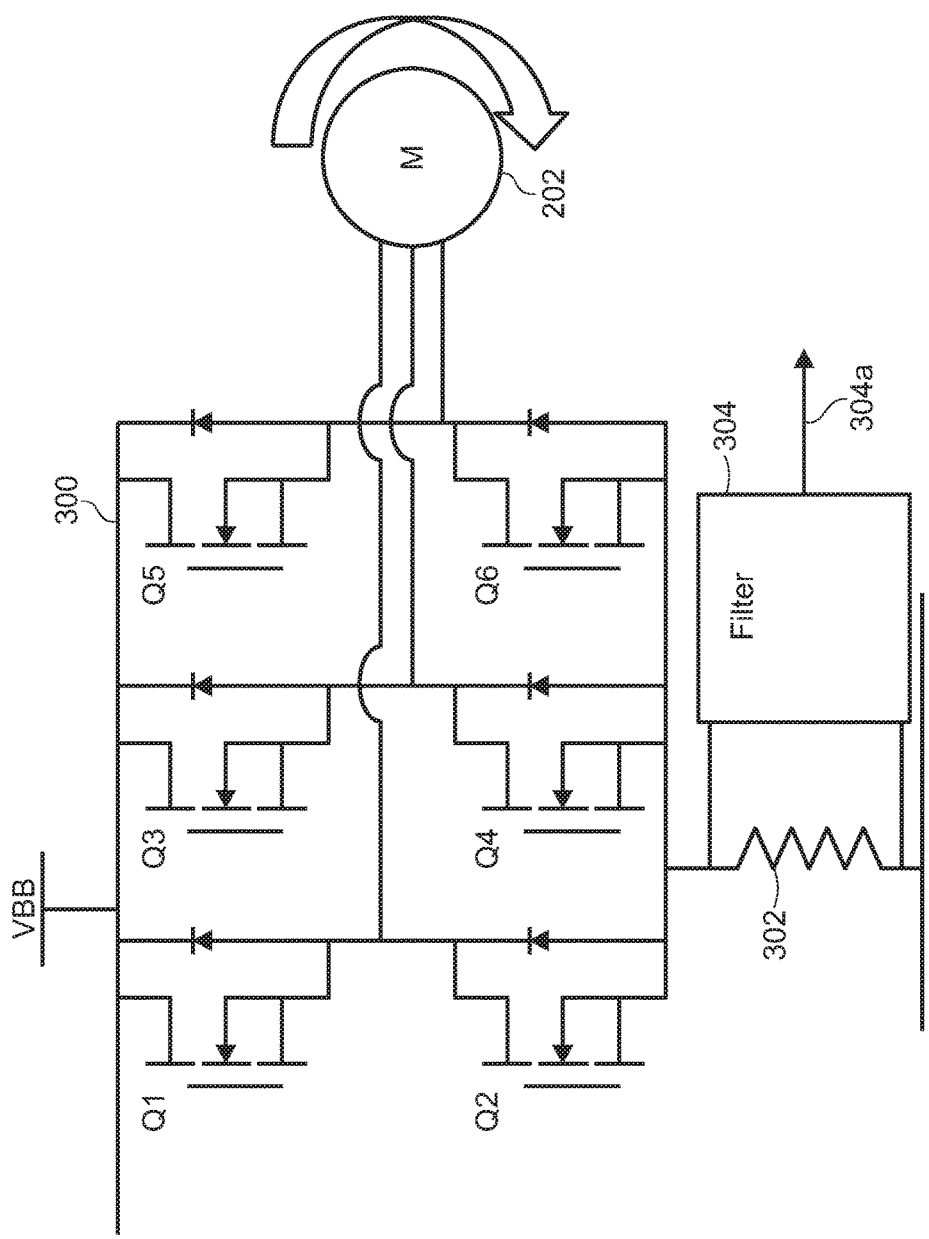
FIG. 3 is a block diagram of a FET bridge for driving a motor.

FIG. 3 is a circuit diagram of circuit 300, which may be the same as or similar to FET bridge circuit 232 (see FIG. 2). Circuit 300 includes FETs Q1-Q6 used to drive motor 202, as described above. Circuit 300 also includes sense resistor 302 which may be used to measure the current flowing through circuit 300 (and through motor 202). In embodiments, resistor 302 is a so-called shunt resistor that has a small resistance so that it does not significantly impede the flow of current (and thus the power applied to) motor 202. For example, resistor 302 may have a value of about 0.1 Ohms.

Circuit 300 may include filter circuit 304 to filter the voltage across resistor 302. The current through motor 202 may fluctuate as each FET pair turns on and off to allow current to flow through the individual windings of motor 202. As a result, the voltage across resistor 302 may also vary. Filter 304 may remove the voltage of the fluctuations to provide a relatively steady state voltage as signal 304a. In embodiments, signal 304a may represent an average voltage across resistor 302. Because the value of resistor 302 is known, voltage signal 304a and Ohm's law can be used to calculate the instantaneous current through resistor 302. This current also represents the instantaneous current through motor 202.

The voltage across motor 202 may also be known. In embodiments, it may be the voltage VBB, less the voltage across resistor 302, less any voltage drop due to transistors Q1-Q6. Because the current through motor 202 and the voltage across motor 202 are known, the impedance of motor 202 may be calculated.

In embodiments, monitoring circuit 228 may include circuitry to calculate the impedance of motor 202 using the signal 304a and the known voltage across motor 202. Monitoring circuit 228 may also monitor and record the speed of motor 202 and the supply voltage supplied to motor 202. The speed may be derived from the switching frequency of FETs Q1-Q6 (and/or the frequency of the signals that drive the gates of FETs Q1-Q6) and the supply voltage may be calculated (as described above) or measured directly by a voltmeter circuit (not shown).

Figure 4:
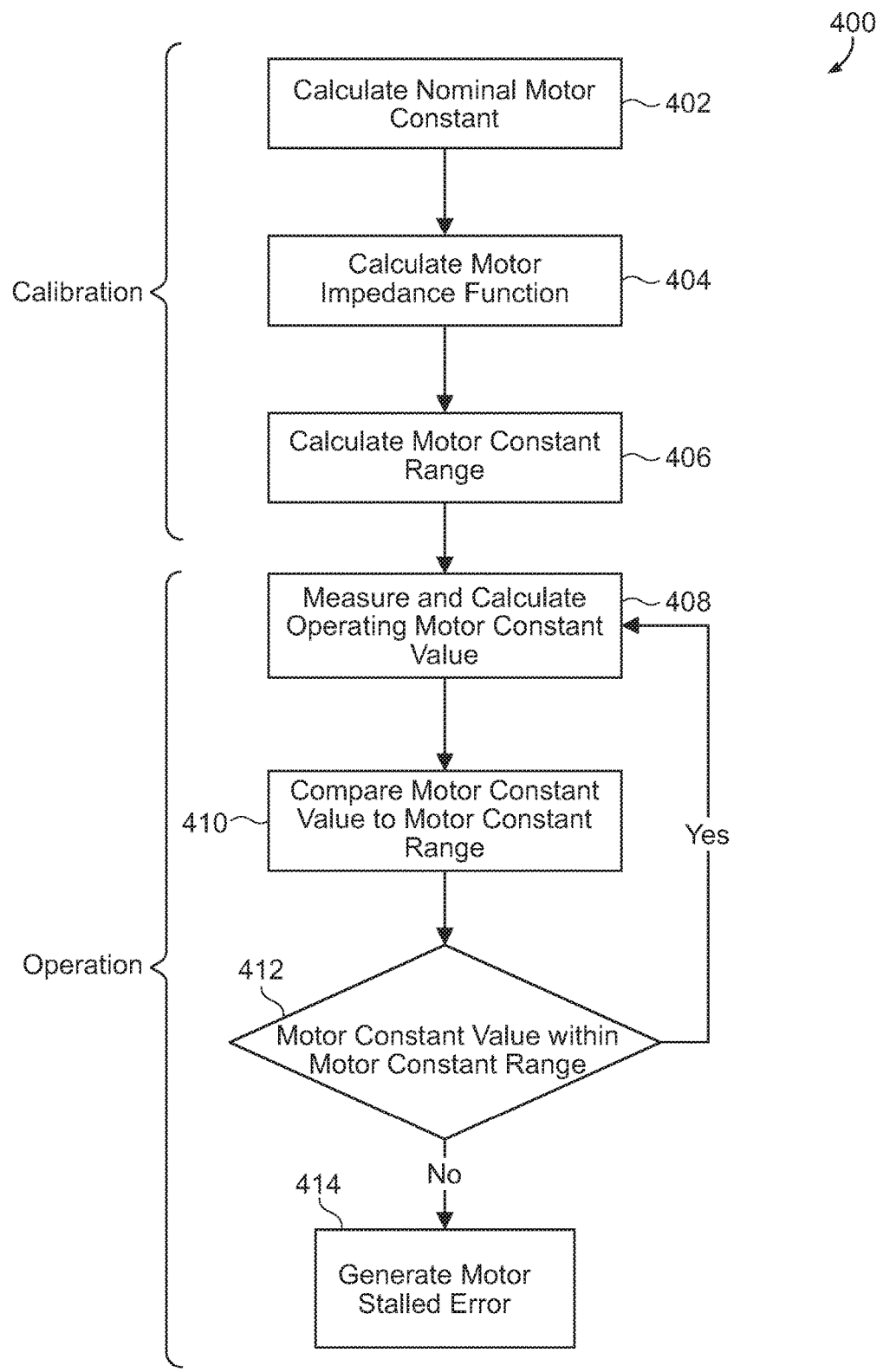
FIG. 4 is a flow diagram of a process for calibrating and operating a motor circuit.

FIG. 4 is a flow diagram of a method 400 for calibrating and operating a motor. Blocks 402-406 correspond to a calibration procedure which may take place once or multiple times. In embodiments, the calibration procedure may take place during manufacturing or assembly when the motor circuit is paired with a motor. Blocks 408-414 correspond to an operation procedure for detecting motor stalls that may take place when the motor is operating.

During calibration in block 402, the motor circuit (e.g. motor circuit 200) may calculate the nominal motor constant K. The motor constant K may be calculated by operating the motor at a nominal speed and measuring the supply voltage ($V_{BB}$), peak duty cycle (Peak DC), impedance of the motor (R), current through the motor (I), and motor frequency (F). The nominal motor constant may be calculated using formula (1) below:

$$K = \frac{(V_{BB} \cdot PeakDC) - \frac{R \cdot I}{PeakDC}}{F} \quad (1)$$

In block 402, circuit 200 may drive motor 202 with 50% peak duty cycle in an open loop voltage mode. Thus, the value of DC and Peak DC may be 0.5. The values of R, I, F, and $V_{BB}$ may be calculated as described above. The peak duty cycle may be the value used to modulate the signals that are used to drive the motor. Peak duty cycle may also be referred to as the modulation ratio.

In block 404, motor circuit 200 may calculate the motor impedance function. The motor impedance function may be a function that defines the motor impedance at different operating frequencies.

Figure 5:
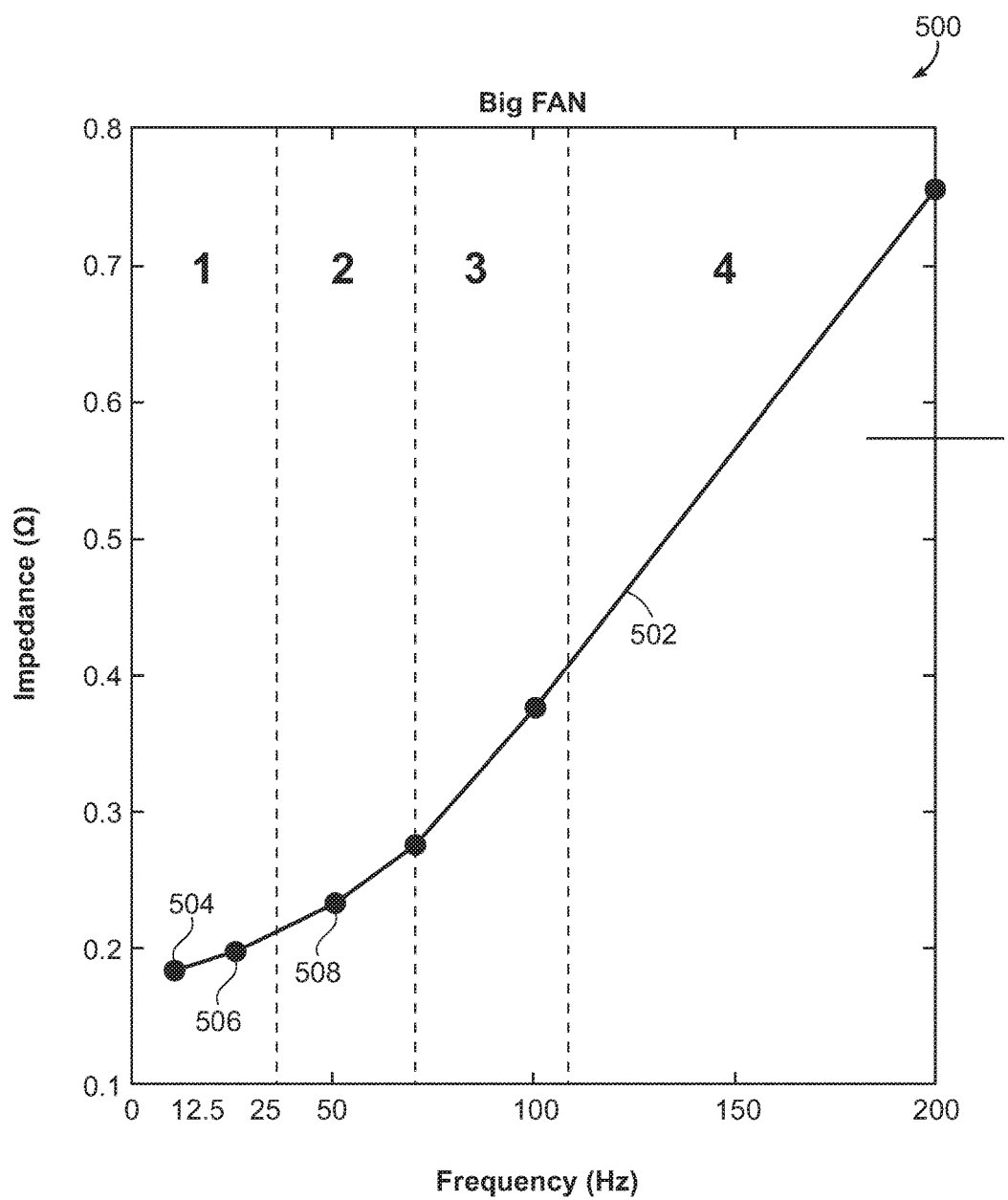
FIG. 5 is a graph of an impedance function.

FIG. 5 is a graph 500 that provides an example of a motor impedance function 502. The horizontal axis of FIG. 5 represents motor frequency in Hz and the vertical axis represents motor impedance in Ohms. The motor impedance function may be defined by a series of measurements (or points) of motor impedance at different operating frequencies. For example, point 504 shows that the impedance of the motor is about 0.18 Ohms about 12.5 Hz, point 506 shows that the impedance of the motor is about 0.2 Ohms at about 25 Hz, point 508 shows that the impedance of the motor is about 0.23 Ohms at 50 Hz, etc. Thus, impedance function 502 may be a piece-wise linear function (i.e. a function comprised of discrete points that can be used to form a linear function) that represents the motor impedance over a range of motor frequencies.

In addition, the linear function may be divided into multiple operating regions (labeled 1-4). Each operating region 1-4 may represent a different frequency range at which motor 202 operates. Impedance function 502 is provided as an example. Different motors may produce different impedance functions. For example, if the motor is operating in operating region 4, the value of the impedance function may be 0.75/200*F. F is the motor operating frequency which may be between 110 and 200 Hz, 0.75 is the value of the impedance at 200 Hz based on operating region 4.

Figure 5A:
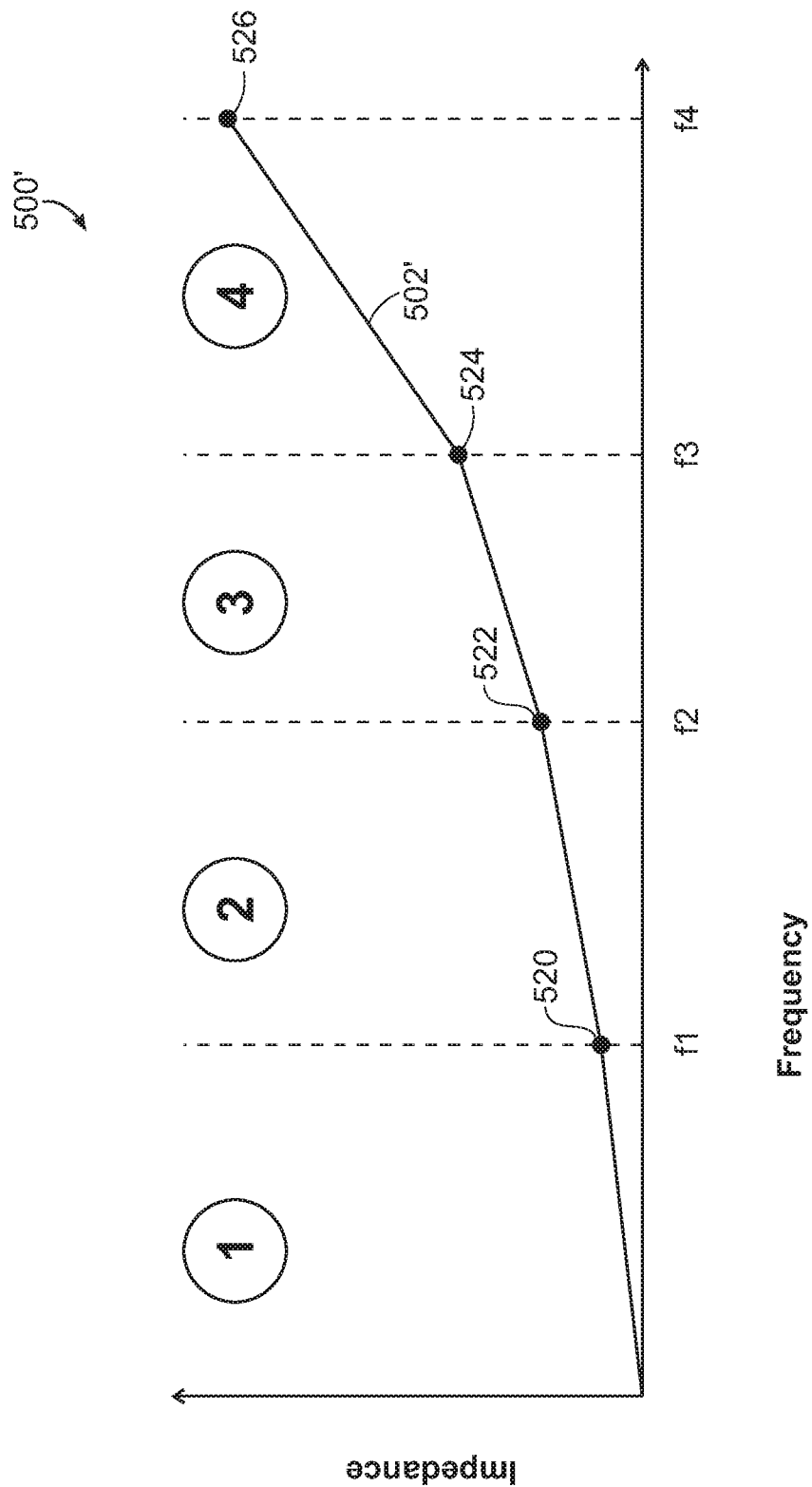
FIG. 5A is another graph of an impedance function.

FIG. 5A is a graph 500' of another embodiment of an impedance function 502'. The horizontal axis of FIG. 5 represents motor frequency in Hz and the vertical axis represents motor impedance in Ohms. The motor impedance function 502' may be defined by a series of measurements (or points) of motor impedance at different operating frequencies. For example, point 520 represents the motor impedance at frequency f1, point 522 represents the motor impedance at frequency f2, point 524 represents the motor impedance at frequency f3, and point 526 represents the motor impedance at frequency f4. Frequencies f1-f4 may be chosen to delineate operating regions 1-4. They may be any frequencies at which the motor can run. In an embodiment, frequency f1 may be $f_{50PD}/2$, frequency f2 may be $f_{50PD}$, frequency f3 may be $f_{50PD}*1.5$, and frequency f4 may be $f_{50PD}*2$, where $f_{50PD}$ is the motor frequency when driven with a fifty-percent peak duty cycle drive signal.

Impedance function 500' may be stored in memory 230. In embodiments, impedance function 500' may be stored as a table or sequence comprising points 520-526.

In other arrangements, impedance function 502' may include fewer than or more than the four points 520-526 shown in graph 500', which may delineate the impedance function into fewer than or more than the four operating regions 1-4. For example, if impedance function 502' comprises five points, impedance function 502' may be delineated into five operating regions.

Returning to FIG. 4, in block 404 motor circuit 200 may calculate and store an impedance function representing the impedance of motor 202 over different operating frequencies. As an example, motor circuit 200 may calculate the impedance of motor 202 while driving motor 202 at a quarter speed, at half speed, at three quarter speed, and at full speed. In other embodiments, the impedance function may include measurements at any sequence of motor speeds.

To calculate the impedance at each speed, motor circuit 200 may measure the supply voltage ($V_{BB}$), the current through motor 202 (I), and the peak duty cycle (Peak DC). The impedance (R) at each frequency may be calculated using formula (2):

$$R = \frac{V_{BB}}{I} \cdot (PeakDC)^2 \qquad (2)$$

During the calibration sequence, the measured points that comprise the impedance function may be stored in EEPROM 230.

In block 406, motor circuit 200 may calculate an acceptable range for the motor constant K. During operation of the motor, motor circuit 200 may constantly monitor and calculate the current value of the motor constant K. If the current value falls outside the acceptable range, it may indicate that motor 202 has stalled. Thus, during calibration, motor circuit 200 may calculate the acceptable range. The acceptable range may be defined by a maximum acceptable value of the motor constant ($K_{MAX}$) and a minimum acceptable value of the motor constant ($K_{MIN}$). As noted above, the nominal value K may be calculated in block 402. $K_{MAX}$ and $K_{MIN}$ may be obtained by multiplying K by predetermined scalar values. For example, in one embodiment, $K_{MAX}=3*K$ and $K_{MIN}=K/2.5$. In other embodiments, different scalar values may be used to calculate $K_{MAX}$ and $K_{MIN}$. The values of $K_{MAX}$ and $K_{MIN}$ may be stored in a memory such as EEPROM 230.

Each of the steps in blocks 402-406 may be performed only once (or, if needed, more than once) during calibration. Once the nominal motor constant K, the impedance function, and the values of $K_{MAX}$ and $K_{MIN}$ are stored in EEPROM 230, motor circuit 200 may use these values to detect motor stalls during motor operation.

Blocks 408-414 may represent normal operation of motor circuit 200 and motor 202 after calibration has occurred. These steps may be performed while motor 202 is running.

In block 408, motor circuit 200 may measure and calculate the operational motor constant ($K_O$) while the motor is operating. To calculate the operational motor constant $K_O$, motor circuit 200 may measure the supply voltage ($V_{BB}$), the motor current (I), the peak duty cycle (Peak DC), and the motor frequency (F) while the motor is running. Formulas (3) may be used to calculate the operational motor constant.

$$K_O = \frac{(V_{BB} \cdot PeakDC) - \frac{R_{EQ} \cdot I}{PeakDC}}{F} \qquad (3)$$

In embodiments, the values of motor frequency (F), and peak duty cycle (Peak DC) may be estimated by motor circuit 200. For example, the estimates may come from the sensorless control algorithm, which is an algorithm that can determine if there are any errors in the position of the motor. The peak duty cycle and motor frequency may be based on the errors (or lack thereof).

The equivalent impedance value $R_{EQ}$ of the motor may be calculated using the stored impedance function described above. To calculate $R_{EQ}$, motor circuit 200 may use the impedance value ($R_Q$) from one of the operating regions of the impedance function. (See FIG. 5A). In particular, motor circuit 200 may use the impedance value from the operating region that matches the current operating state of the motor. For example, if the motor is operating a frequency F that falls between frequencies f3 and f4 (see FIG. 5A), motor circuit 200 may use the value of point 526 as the impedance value $R_Q$. Accordingly, motor circuit 200 may also use the frequency f4 as the quadrant frequency $F_Q$.

Once $R_Q$ and $F_Q$ are chosen, motor circuit 200 may use formula (4) below to calculate the value of the equivalent impedance value ($R_{EQ}$).

$$R_{EQ} = \frac{R_Q \cdot F}{F_Q} \qquad (4)$$

When $R_{EQ}$ is calculated, the value of the operating motor constant $K_O$ can be calculated using formula (3).

In block 410, motor circuit 200 may compare the value of the operational motor constant $K_O$ to the maximum allowable value the motor constant ($K_{MAX}$) and the minimum allowable value of the motor constant ($K_{MIN}$) stored in EEPROM 230. In block 412, if the operational motor constant $K_O$ falls between $K_{MIN}$ and $K_{MAX}$, motor circuit 200 will continue to operate normally and return to block 408 to calculate a new value for $K_O$. If the operation motor constant $K_O$ falls outside the range defined by $K_{MIN}$ and $K_{MAX}$, motor circuit 200 may proceed to block 414 to generate an error indicating motor 202 is stalled. In embodiments, motor circuit 200 may generate the error by changing a voltage on an output pin, by transmitting an error signal on a serial bus, by storing an error code in memory or a register, by triggering an interrupt, by raising a software exception, or by any other means of generating an error condition.

Figure 6:
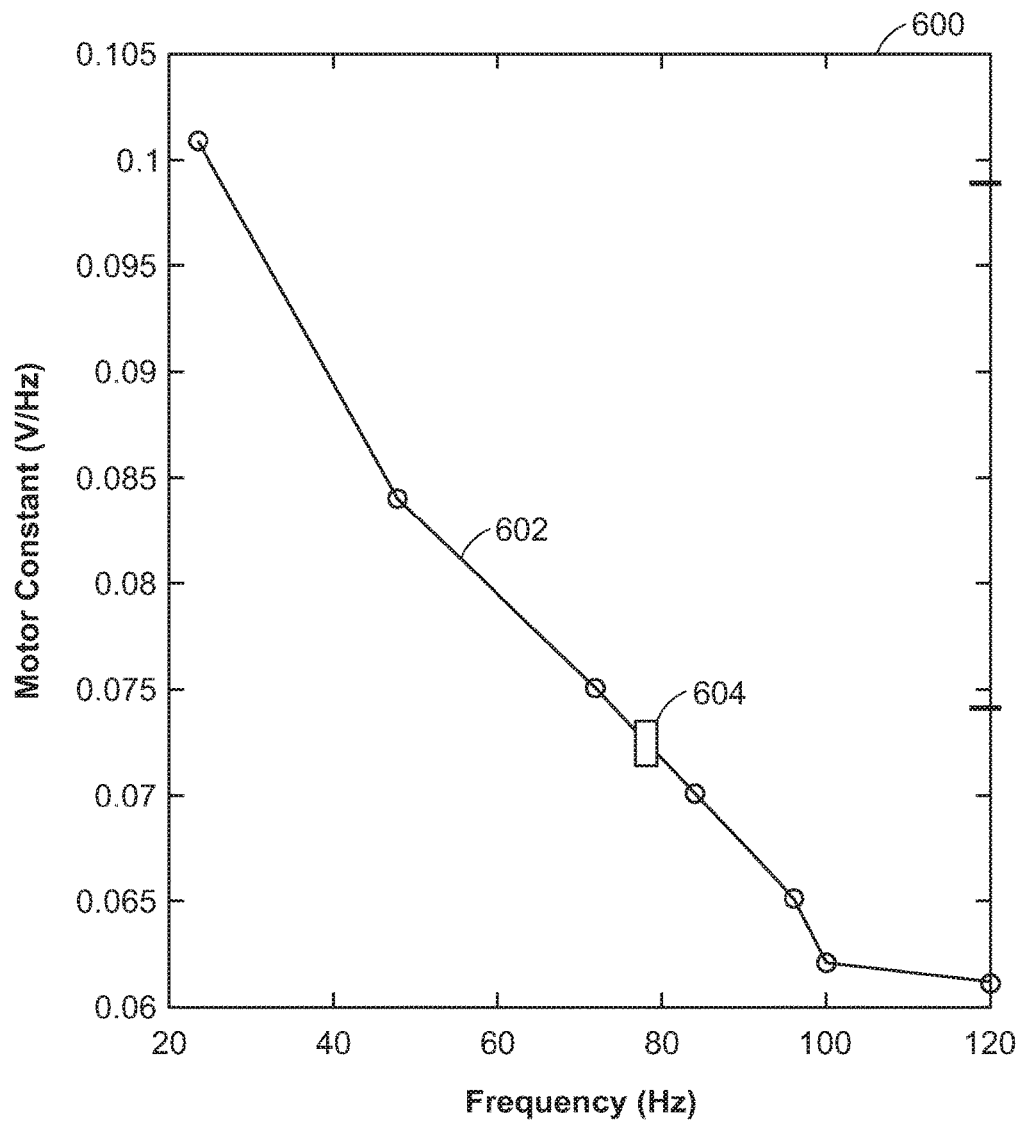
FIG. 6 is a graph of a motor constant.

Referring to FIG. 6, graph 600 includes a function 602 representing motor constants K calculated at various motor frequencies. The horizontal axis represents frequency (i.e. speed) of the motor in Hz and the vertical axis represents the calculated motor constant K at each speed. As shown, the motor constant K may decrease in value as the frequency of the motor increases. The band 604 may represent the acceptable range of motor constants at a frequency of about 78 Hz. For example, at frequency 78 Hz, the motor constant K may be about 0.0725. The top of band 604 may represent $K_{MAX}$ at 78 Hz and the bottom of band 604 may represent $K_{MIN}$ at 78 Hz. If the motor is operating at about 78 Hz, and the value of K falls within band 604, the motor circuit 200 may drive the motor normally without detecting a stall.

Figure 7:
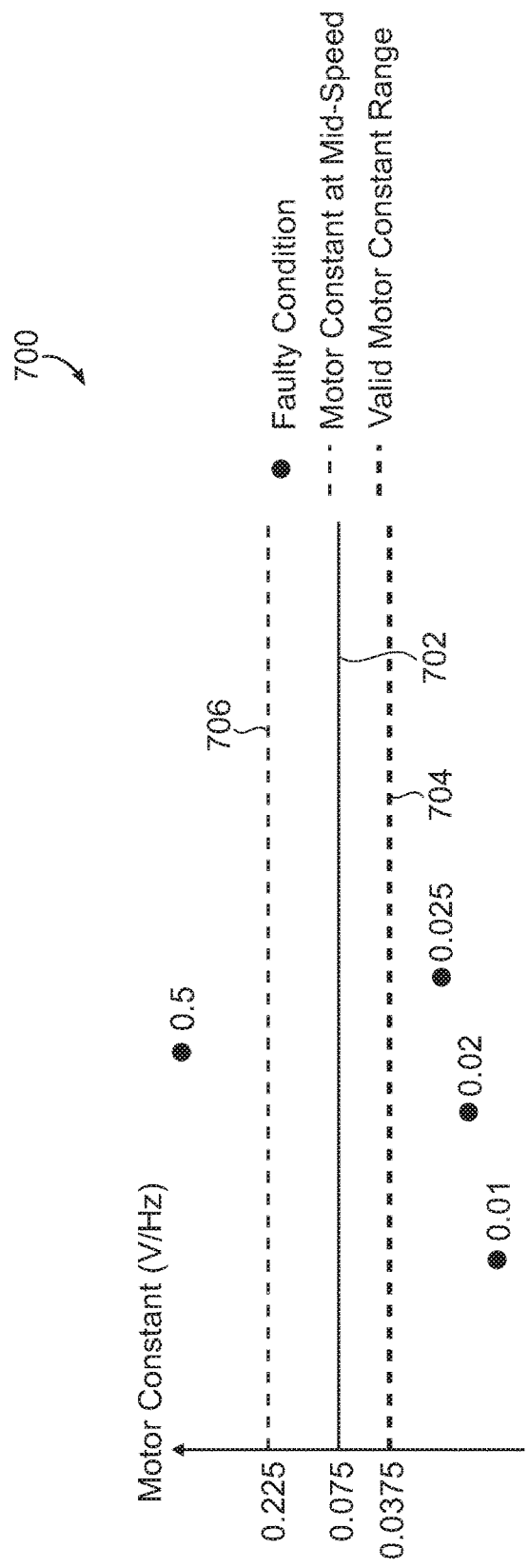
FIG. 7 is a plot of an acceptable motor constant range.

Referring to FIG. 7, a plot 700 shows the acceptable band of motor constants K. Line 702 represents the nominal motor constant calculated in block 402. (See FIG. 4). Line 704 represents $K_{MIN}$ and line 706 represents $K_{MAX}$ calculated in block 406. The area between lines 704 and 706 represents the acceptable range of values for $K_O$. If the value of $K_O$ calculated in block 408 while the motor is operating falls between lines 704 and 706, motor circuit 200 may continue to operate normally. If the value of $K_O$ calculated in block 408 falls outside lines 704 and 706 (as shown, for example, by the points labeled 0.01, 0.02, 0.025, and 0.5), it may indicate that motor 202 is stalled. In this case, motor circuit 200 may generate an error signal.

The embodiment(s) presented above serve to illustrate various concepts, structures, and techniques, which are the subject of this patent. Other embodiments incorporating these concepts, structures, and techniques may be used. Accordingly, the scope of the patent should not be limited to the described embodiments but rather should be limited only by the spirit and scope of the following claims. All patent references, patent application references, and other documents cited in the specification of this patent are incorporated by reference in their entirety.

What is claimed is:

1. A method of driving a motor with a motor circuit, the method comprising:
   calculating a nominal motor constant, by a motor test circuit during configuration of the motor circuit, the nominal motor constant representing operation of the motor in a nominal mode;
   calculating, by the motor test circuit during configuration of the motor circuit, a motor impedance function comprising a motor impedance at one or more motor frequencies;
   storing one or more values of the impedance function in a memory of the motor circuit;
   calculating, by the motor test circuit during configuration of the motor circuit, a range of acceptable motor constant values based on the nominal motor constant;
   calculating, by a motor monitoring circuit during operation of the motor, an operating motor constant value for the motor while operating, wherein the operating motor constant value is based on at least one of the stored values of the impedance function; and
   comparing, by the motor monitoring circuit, the motor constant value to the range of acceptable motor constants to detect if a motor stall has occurred.

2. The method of claim 1 wherein calculating the nominal motor constant value comprises measuring or estimating motor frequency, and measuring bridge current, and supply voltage.

3. The method of claim 1 wherein calculating the motor impedance function comprises measuring motor frequency, bridge current, and peak duty cycle.

4. The method of claim 1 wherein calculating the motor impedance function comprises driving motor at the one or more motor frequencies and calculating a motor impedance value at each of the plurality of frequencies.

5. The method of claim 4 wherein calculating the range of acceptable motor constant values comprises determining a maximum acceptable motor constant value and a minimum acceptable motor constant value.

6. The method of claim 5 further comprising storing the maximum acceptable motor constant value and the minimum acceptable motor constant value in the memory.

7. The method of claim 1 wherein calculating the motor impedance function comprising interpolating a motor impedance value at one or more frequency values.

8. The method of claim 1 wherein storing one or more values of the impedance function comprises storing a piecewise linear function comprising a plurality of motor impedance values.

9. The method of claim 1 wherein calculating the operating motor constant value comprises measuring supply voltage, bridge current, peak duty cycle, and frequency.

10. The method of claim 1 wherein calculating the operating motor constant value comprises retrieving one or more values of the impedance function from the memory and using the one or more retrieved values to calculate the motor constant value for the motor while operating.

11. The method of claim 1 wherein calculating the operating motor constant value comprises continuously calculating the operating motor constant value.

12. The method of claim 1 wherein calculating the operating motor constant value comprises periodically calculating the operating motor constant value.

13. The method of claim 1 further comprising generating an error signal if the operating motor constant value falls outside of the range of acceptable motor constant values.

14. A system comprising:
    a motor circuit;
    a calibration test circuit configured to be coupled to the motor circuit to:
    calculate a nominal motor constant representing operation of a motor in a nominal mode;
    calculate a motor impedance function comprising one or more motor impedance values at one or more motor frequencies;
    store one or more values of the impedance function in a memory of the motor circuit; and
    calculate a range of acceptable motor constant values based on the nominal motor constant;
    wherein the motor driver circuit is configured to:
    calculate an operating motor constant value for the motor while operating, wherein the operating motor constant value is based on at least one of the stored values of the impedance function; and
    compare the motor constant value to the range of acceptable motor constant values stored in the memory to detect if a motor stall has occurred.

15. The system of claim 14 wherein calibration circuit is configured to measure motor frequency, bridge current, and supply voltage.

16. The system of claim 14 wherein the calibration circuit is configured to calculate the motor impedance function by measuring motor frequency, bridge current, and peak duty cycle.

17. The system of claim 14 wherein the calibration circuit is configured to calculate the motor impedance function by driving the motor at the one or more frequencies and calculating a motor impedance value at each of the plurality of frequencies.

18. The system of claim 17 wherein the calibration circuit is configured to calculate the range of acceptable motor constant values by determining a maximum acceptable motor constant value and a minimum acceptable motor constant value.

19. The system of claim 16 the motor driver circuit is further configured to interpolate a motor impedance value using the motor impedance function.

20. The system of claim 14 wherein the calibration circuit is configured to store a piece-wise linear function comprising a plurality of motor impedance values in a memory.

21. The system of claim 14 wherein the motor driver circuit is configured to calculate the motor constant value by measuring supply voltage, bridge current, peak duty cycle, and frequency.

22. The system of claim 14 wherein the motor driver circuit is configured to calculate the motor constant value continuously while the motor is operating.

23. The system of claim 14 wherein the motor driver circuit is configured to calculate the motor constant value periodically according to a predetermined schedule while the motor is operating.

24. The system of claim 14 wherein the motor driver circuit is further configured to generate an error signal if the motor constant value falls outside of the range of acceptable motor constant values.

* * * * *